United States Patent
Tiziani et al.

(10) Patent No.: US 12,322,684 B2
(45) Date of Patent: Jun. 3, 2025

(54) METHOD OF MANUFACTURING ELECTRONIC DEVICES AND CORRESPONDING ELECTRONIC DEVICE

(71) Applicants: STMicroelectronics S.r.l., Agrate Brianza (IT); STMicroelectronics Pte Ltd, Singapore (SG)

(72) Inventors: Roberto Tiziani, Nerviano (IT); Laurent Herard, Saint Foy les Lyon (FR)

(73) Assignees: STMicroelectronics S.r.l., Agrate Brianza (IT); STMicroelectronics Pte Ltd, Singapore (SG)

( * ) Notice: Subject to any disclaimer, the term of this patent is extended or adjusted under 35 U.S.C. 154(b) by 479 days.

(21) Appl. No.: 17/729,452

(22) Filed: Apr. 26, 2022

(65) Prior Publication Data
US 2022/0352057 A1    Nov. 3, 2022

(30) Foreign Application Priority Data

Apr. 30, 2021   (IT) ................. 102021000011096

(51) Int. Cl.
*H01L 23/498* (2006.01)
*H01L 21/48* (2006.01)
*H01L 23/13* (2006.01)

(52) U.S. Cl.
CPC .... *H01L 23/49811* (2013.01); *H01L 21/4853* (2013.01); *H01L 23/13* (2013.01); *H01L 23/49838* (2013.01)

(58) Field of Classification Search
CPC .......... H01L 23/49811; H01L 21/4853; H05K 1/111
See application file for complete search history.

(56) References Cited

U.S. PATENT DOCUMENTS

| | | | | |
|---|---|---|---|---|
| 4,348,751 A | * | 9/1982 | Kosaka | H01M 50/216 968/878 |
| 4,420,877 A | * | 12/1983 | McKenzie, Jr. | H05K 7/1015 228/180.1 |
| 2003/0096514 A1 | * | 5/2003 | Ho | H05K 1/141 439/70 |
| 2004/0129454 A1 | | 7/2004 | Miyamoto et al. | |
| 2009/0194884 A1 | * | 8/2009 | Stolze | H05K 3/3426 257/E23.024 |
| 2010/0127389 A1 | | 5/2010 | Obiraki et al. | |
| 2019/0320561 A1 | | 10/2019 | Lim et al. | |

OTHER PUBLICATIONS

IT Search Report and Written Opinion for priority application, IT 102021000011096, report dated Jan. 20, 2022, 8 pgs.

* cited by examiner

*Primary Examiner* — Michele Fan
(74) *Attorney, Agent, or Firm* — Crowe & Dunlevy LLC (57) ABSTRACT

A substrate includes electrically-conductive tracks. A semiconductor chip is arranged on the substrate and electrically coupled to selected ones of the electrically-conductive tracks. Containment structures are provided at selected locations on the electrically-conductive tracks, where the containment structures have respective perimeter walls defining respective cavities. Each cavity is configured to accommodate a base portion of a pin holder. These pin holders are soldered to the electrically-conductive tracks within the cavities defined by the containment structures. Each containment structure may be formed by a ring of resist material configured to receive solder and maintain the pin holders in a desired alignment position.

14 Claims, 5 Drawing Sheets

METHOD OF MANUFACTURING ELECTRONIC DEVICES AND CORRESPONDING ELECTRONIC DEVICE

PRIORITY CLAIM

This application claims the priority benefit of Italian Application for Patent No. 102021000011096, filed on Apr. 30, 2021, the content of which is hereby incorporated by reference in its entirety to the maximum extent allowable by law.

TECHNICAL FIELD

The description relates to manufacturing electronic devices.

One or more embodiments can be applied to power electronic devices, such as power inverters, which may be suitable for use in various application areas such as the sectors of automotive electronics and/or industrial electronics.

BACKGROUND

A power inverter is an electronic device configured to convert a DC (direct current) power source into an AC (alternating current) power source.

In the automotive sector or industrial sector, power inverters may be designed to support high power conversion, e.g., in the range of several tens of kW or even several hundreds of kW or more. For instance, power inverters may support output currents in the exemplary range of 200 A to 1000 A and/or output voltages in the exemplary range of 200 V to 1200 V.

A conventional power inverter comprises discrete power chips (e.g., solid-state devices such as metal-oxide-semiconductor field effect transistors, silicon carbide transistors, and/or gallium nitride transistors arranged to implement one or more half-bridge circuits) attached on one or more power ceramic substrates providing electrical insulation. As conventional in the art, the surface of a power ceramic substrate where the discrete chips are mounted is provided with a metallic layer which can be patterned to provide electrically-conductive tracks to route signals from/to the discrete chips. The ceramic substrates are conventionally attached to a heat sink (e.g., a metallic heat sink, preferably including copper) for cooling (e.g., for liquid cooling). The terminals of the power chips (e.g., the control or gate terminals) can be electrically connected to the electrically-conductive tracks provided on the surface of the substrate. The electrically-conductive tracks in turn are electrically couplable to a printed circuit board (PCB) which can be mounted on the power inverter device (e.g., on top of it), typically by means of electrically-conductive pins, e.g., of the press-fit type. The printed circuit board usually hosts the integrated circuits (ICs) which provide the control or drive signals for the power chips of the inverter device. For instance, the printed circuit board may have mounted thereon one or more microcontroller circuits, one or more galvanic insulators, one or more gate driver circuits, etc.

In certain applications, a three-phase power inverter may be used to provide three output power signals for driving a three-phase electric motor. Traction motors for hybrid electric vehicles (HEV) or battery electric vehicles (BEV) are exemplary of such three-phase electric motors, but three-phase motors can be generally used in various industrial and/or automotive applications.

In the case of a three-phase inverter, the inverter device conventionally comprises three DC-AC half-bridge arrangements in a parallel configuration. Each half-bridge arrangement is provided on an independent (e.g., physically separate) insulating substrate, with the three substrates possibly mounted on the same heat sink. Each half-bridge arrangement provides a respective output power signal or "phase", conventionally referred to as the U phase, the V phase and the W phase.

In a conventional power electronic device, such as a power inverter device, the electrical connection between the device itself and a printed circuit board may be impaired by a poor accuracy in the positioning (e.g., a poor alignment) of the electrically-conductive pins provided (e.g., soldered) on the substrates. Such a poor accuracy may be due, for instance, to the reflow of the solder material used for soldering the electrically-conductive pins to the substrates. In the case of multi-substrate devices (e.g., a three-phase power inverter device), the poor accuracy may also be due to the reflow of the solder material used for soldering the substrates to the common heat sink. As a consequence of lead-free banning legislation, lead-free solder alloys are conventionally used (e.g., a tin-based solder alloy). The solder material may easily melt when power ceramic substrates are attached to the heat sink by a tin-based alloy.

Therefore, there is a need in the art to provide techniques for improving the accuracy of the positioning of electrically-conductive pins (e.g., press-fit pins) in a method of manufacturing power electronic devices.

SUMMARY

One or more embodiments contribute to providing techniques for improving the accuracy of the positioning of the electrically-conductive pins in power electronic devices.

One or more embodiments may relate to a method.

One or more embodiments may relate to a corresponding electronic device.

In one or more embodiments, a method may comprise providing at least one substrate having electrically-conductive tracks patterned thereon. The method may further comprise arranging on the at least one substrate at least one semiconductor chip, and electrically coupling the at least one semiconductor chip to selected ones of the electrically-conductive tracks. The method may further comprise providing, at selected locations on the electrically-conductive tracks, containment structures having respective perimeter walls which define respective cavities configured to accommodate a base portion of respective pin holders, and soldering the respective pin holders within the cavities defined by the containment structures on the electrically-conductive tracks.

In one or more embodiments, an electronic device may comprise at least one substrate having electrically-conductive tracks patterned thereon, and at least one semiconductor chip arranged on the at least one substrate. The at least one semiconductor chip may be electrically coupled to selected ones of the electrically-conductive tracks. The electronic device may further comprise containment structures having respective perimeter walls which define respective cavities at selected locations on the electrically-conductive tracks, the cavities being configured to accommodate a base portion of respective pin holders. The electronic device may further comprise pin holders soldered within the cavities defined by the containment structures on the electrically-conductive tracks.

One or more embodiments may thus facilitate a more accurate positioning of the electrically-conductive pins provided on a power substrate for a power device.

BRIEF DESCRIPTION OF THE DRAWINGS

One or more embodiments will now be described, by way of example only, with reference to the annexed figures, wherein.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The headings/references used herein are provided merely for convenience and hence do not define the extent of protection or the scope of the embodiments.

Throughout the figures annexed herein, unless the context indicates otherwise, like parts or elements are indicated with like references/numerals and a corresponding description will not be repeated for brevity.

Figure 1:
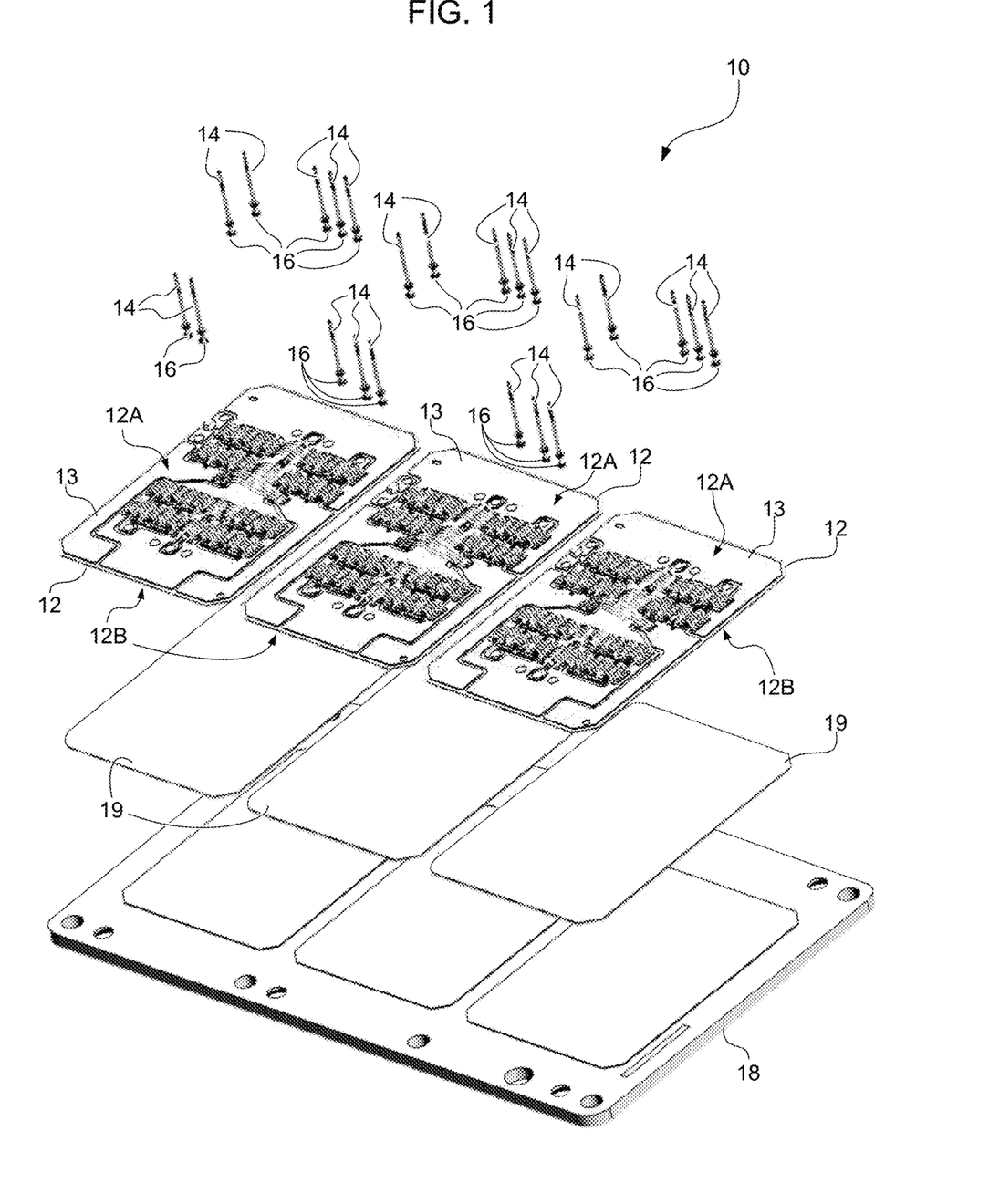
FIG. 1 is an exploded view exemplary of certain components of a three-phase power inverter device according to one or more embodiments of the present description.

By way of introduction to the detailed description of exemplary embodiments, reference may first be made to FIG. 1, which is an exploded view exemplary of certain components of a three-phase power inverter device 10.

As exemplified in FIG. 1, a three-phase inverter device 10 may comprise a plurality of (e.g., three) electrically-insulating power substrates 12. The substrates 12 comprise a layer of dielectric material (e.g., a ceramic material such as an oxide material or a nitride material, for instance aluminum oxide, aluminum nitride, silicon nitride and/or beryllium oxide). The substrates 12 have respective front (e.g., top or upper) surfaces 12A and respective back (e.g., bottom or lower) surfaces 12B opposed to the front surfaces 12A. The front surface 12A of each substrate 12 is provided with a metallic layer 13 (e.g., a copper layer) which can be patterned to provide electrically-conductive tracks for routing electrical (power) signals. Direct bonded copper (DBC) substrates or active metal brazed (AMB) substrates are exemplary of known substrates which may be used in one or more embodiments.

Power transistors such as insulated-gate bipolar transistors (IGBT), metal-oxide-semiconductor field-effect transistors (MOSFET), optionally silicon carbide (SiC) transistors or gallium nitride (GaN) transistors, and/or other electronic devices or passive components such as thermistors, gate resistors, and the like, are arranged on the front surface 12A of each substrate 12, e.g., providing a half-bridge circuit arrangement on each substrate 12. Optionally, plural transistors may be coupled in parallel in each branch of the half-bridge arrangements to facilitate operation at high power levels. The terminals of the transistors (or other electronic components) arranged on the front surface 12A of each substrate 12 are electrically coupled (e.g., by means of bonding wires or by means of other interconnection means such as clips or tapes) to the electrically-conductive tracks obtained by patterning the metallic layer 13 provided on the front surface 12A of the substrate 12.

A set of electrically-conductive (e.g., metallic) pins 14 (e.g., press-fit pins) is provided at the front surface 12A of each substrate 12 over the metallic layer 13, extending from the front surface 12A and orthogonally to the front surface 12A (e.g., vertically). The pins 14 are electrically coupled to at least some of the electrically-conductive tracks extending at the front surface 12A (e.g., those tracks which in turn are coupled to the control terminals of the transistors mounted on the substrate 12) and therefore provide a means for electrically coupling the transistors in the inverter device 10 to an external circuitry (e.g., a gate control circuitry providing control signals for controlling the switching operation of the transistors in the inverter device 10). The pins 14 are mechanically and electrically coupled to the metallic layer 13 by means of pin holders 16, as further discussed also with reference to FIGS. 4 and 5.

Each of the substrates 12 may be attached onto a common base plate 18, which acts as a heat sink, via solder preforms 19 interposed between the back surface 12B of the substrates 12 and the base plate 18.

Figure 2:
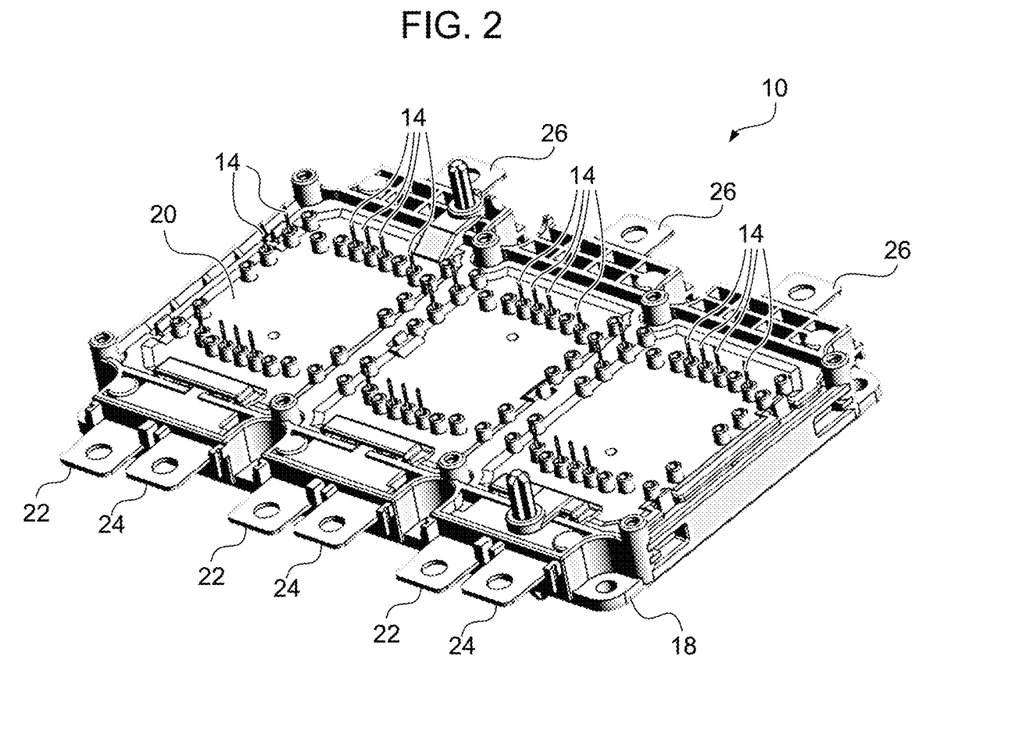
FIG. 2 is a perspective front view exemplary of a packaged power inverter device according to one or more embodiments of the present description.
Figure 3:
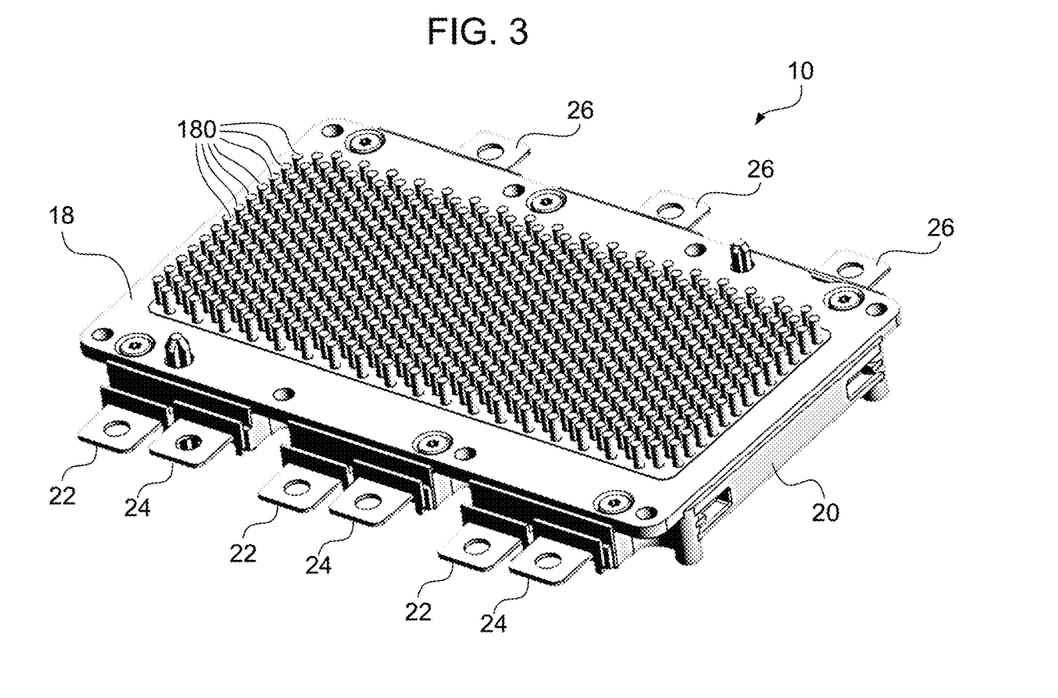
FIG. 3 is a perspective back view exemplary of a packaged power inverter device according to one or more embodiments of the present description.

With reference to FIGS. 2-3, once the substrates 12 are attached onto the common base plate 18, a cover plate 20 may be fixed to (e.g., screwed onto) the base plate 18 over the substrates 12 to enclose the electrical circuitry into a casing.

FIG. 2 is a perspective view of a packaged power inverter device 10, where the substrates 12 and the corresponding power circuitry are enclosed within a casing comprising (e.g., consisting of) the base plate 18 and the cover plate 20. As exemplified in FIG. 2, the cover plate 20 comprises a set of holes aligned with the expected positions of the electrically-conductive pins 14, so that the (upper) end portions of the pins 14 protrude out of the cover plate 20 in order to be available for coupling (e.g., via press-fitting) to a printed circuit board (not visible in the Figures annexed herein for the sake of ease of illustration only). The printed circuit board may host the (gate) control circuitry which provides the (gate) control signals to the power inverter device 10 via the electrically-conductive pins 14.

FIG. 3 is another perspective view of the packaged power inverter device 10 enclosed within the casing comprising the base plate 18 and the cover plate 20, where the inverter device 10 is depicted upside down with respect to FIG. 2, i.e., with the base plate 18 facing upwards and the cover plate 20 facing downwards. As exemplified in FIG. 3, the base plate 18 may comprise a plurality of pins or fins 180 protruding (e.g., orthogonally) from the base plate 18 to improve the heat dissipation capability of the base plate 18, which acts as a heat sink.

As exemplified in FIGS. 2 and 3, the cover plate 20 may comprise a pair of input bus bars 22, 24 for each substrate 12 in the inverter 10 (e.g., for each phase of the inverter) which are configured to receive an input DC power from a DC power source (e.g., from a high-voltage battery of a vehicle). For instance, each bus bar 22 may be configured to be coupled to a positive terminal of a high-voltage battery, and each bus bar 24 may be configured to be coupled to a negative terminal of the high-voltage battery. Similarly, the cover plate 20 may comprise an output bus bar 26 for each substrate 12 in the inverter 10 (e.g., for each phase of the inverter) which is configured to supply the output AC power (e.g., to a three-phase motor in a vehicle) of the corresponding inverter phase. For instance, each bus bar 26 may be coupled to the output node of the corresponding half-bridge arrangement in the inverter device 10.

Figure 4:
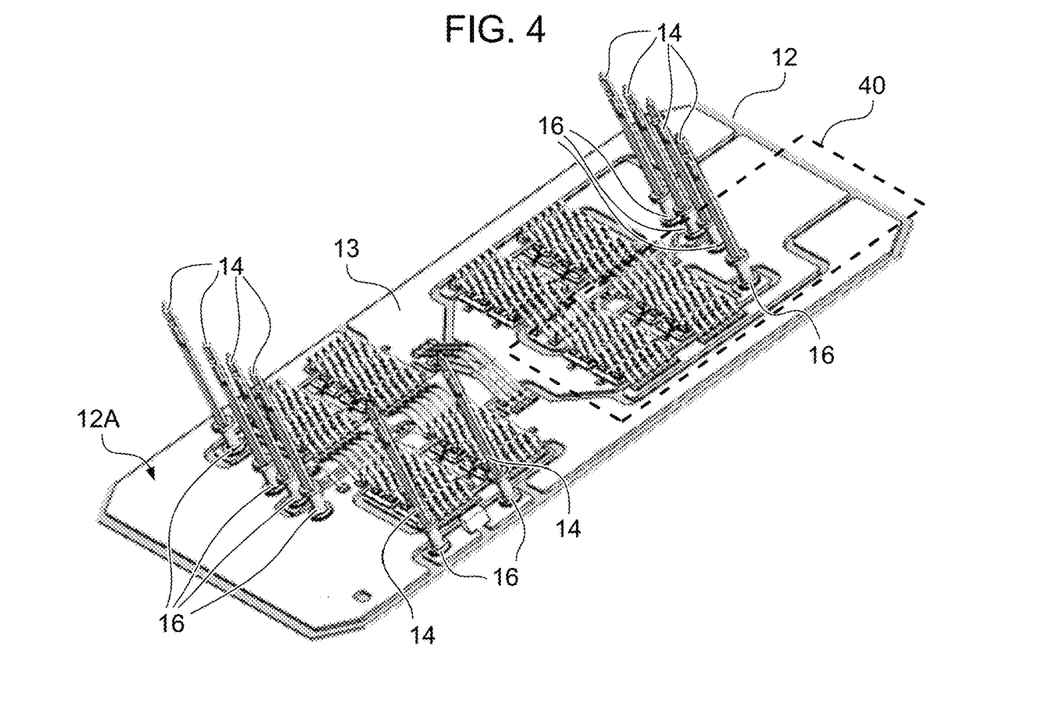
FIG. 4 is a perspective view exemplary of a half-bridge circuit arrangement implemented on a power substrate for inclusion in a packaged power inverter device according to one or more embodiments of the present description.
Figure 5:
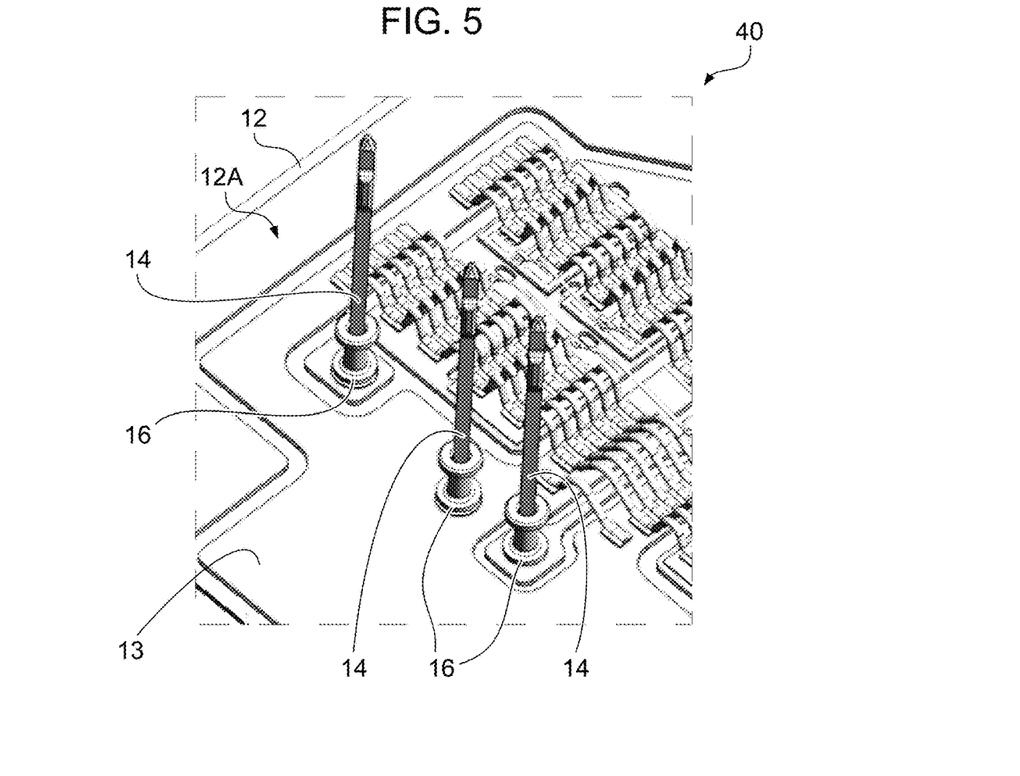
FIG. 5 is an enlarged perspective view exemplary of a portion of the half-bridge circuit arrangement of FIG. 4.

FIG. 4 is a perspective view exemplary of a half-bridge circuit arrangement implemented on a substrate 12 before soldering on the common base plate 18, and FIG. 5 is an enlarged view of the portion 40 of FIG. 4 from a different perspective. In a manufacturing process, the pin holders 16 are arranged on the metallic layer 13 of the substrate 12 before attaching the substrate 12 to the common base plate 18, and the electrically-conductive pins 14 are inserted into the holders 16 after attaching the substrate 12 to the common base plate 18. The pin holders 16 may have a substantially cylindrical shape with a hole extending at least partially along the cylinder axis, the hole being configured to receive a respective pin 14 (e.g., an end portion thereof). The pin holders 16 have a substantially flat base that is soldered on the substrate 12 (in particular, on the metallic layer 13) at certain selected positions. In one or more embodiments, each substrate 12 may have six or more pin holders 16 arranged thereon (e.g., to provide electrical connection to the gate terminals of the transistors, plus current sensing terminals).

It is noted that in case a plurality of substrates 12 is attached onto a common base plate 18 after the pin holders 16 have already been soldered onto the substrates, achieving a correct positioning of the pins 14 (e.g., a correct alignment for electrical connection to a PCB) may not be straightforward. For instance, in case three substrates 12 each having ten pins 14 are attached on a common base plate 18, the thirty pins 14 should fit (e.g., be aligned to) the holes in the cover plate 20 and the holes in the printed circuit board to which the inverter device 10 is designed to be coupled (e.g., via press-fit coupling). If one or more of the pins 14 is offset from its expected position, mounting of the printed circuit board on the inverter device 10 may fail. In certain cases, the offset pin(s) may be deformed during mounting of the cover plate 20 and/or the PCB, therefore preventing any recovery action. The yield of the mounting step may thus be negatively affected by a poor accuracy in the alignment of the pin holders 16 on the substrates 12 (i.e., in their positioning). The accuracy of the alignment of the pin holders 16 can be affected by two factors.

Figure 6:
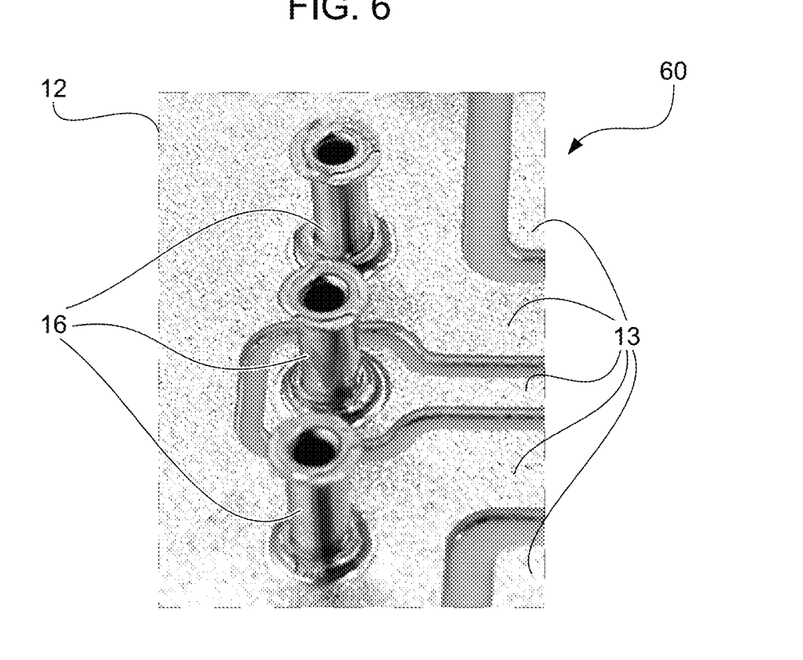
FIG. 6 is a perspective view exemplary of a portion of a power substrate having pin holders mounted thereon according to one or more embodiments of the present description.

A first possible source of misalignment of the pin holders 16 may result from the step of attaching the pin holders 16 onto the substrate 12 (in particular, onto the electrically-conductive layer 13), as exemplified in FIG. 6, which exemplifies a portion 60 of a substrate 12 having three pin holders 16 mounted thereon.

In a manufacturing process, the cylindrical pin holders 16 with a flat base are soldered on the substrate 12 with solder paste by means of stencil printing and reflow process. Stencil printing may be optimized to reduce the shift of the pin holders 16 during the liquid phase. However, the surface of the metallic layer 13 may have an uneven wettability, and the pin holders 16 may shift (i.e., move "sidewise" or "laterally" over the surface of the metallic layer 13) during the solder reflow process.

A second possible source of misalignment of the pin holders 16 may result from the step of attaching plural substrates 12 onto a common base plate 18. In a manufacturing process, the substrates 12 are mounted on the base plate 18 by means of solder preforms 19 and vacuum reflow. A mechanical mask may be used during the vacuum reflow process to align the substrates 12 with respect to one another and/or with respect to the base plate 18. However, the mechanical mask is typically positioned at a certain distance from the substrates 12 (e.g., with a certain tolerance or clearance). Such a clearance may account for possible variations of the substrate dimensions, and/or may facilitate removal of the mechanical mask after the reflow process while avoiding chipping of the ceramic substrates 12. In some cases, such a clearance gap may be as wide as 0.25 mm (1 mm=$10^{-3}$ m). As a result of such a clearance distance or gap between the mask and the substrates 12, the substrates 12 may shift (i.e., move "sidewise" or "laterally" over the surface of the base plate 18) during the reflow process.

Therefore, one or more embodiments may provide an improved method of arranging the pin holders 16 onto the substrate(s) 12 which improves the positioning accuracy of the pin holders.

According to one or more embodiments, a "self alignment mask" may be provided on the substrate 12 (in particular, on the metallic layer 13) for the pin holder soldering step. Additionally, the pin holders 16 may be mounted on the substrate(s) 12 after the substrate(s) 12 is mounted on the base plate 18.

Figure 7:
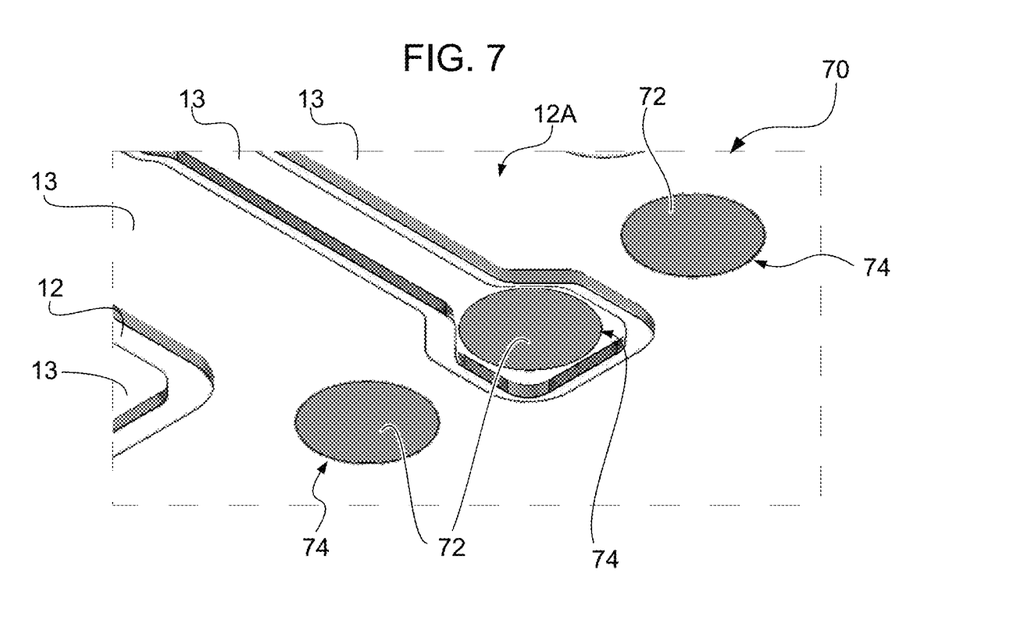
FIG. 7 is a perspective view exemplary of a portion of a power substrate for a power electronic circuit in a step of a manufacturing method according to one or more embodiments of the present description.

As exemplified in FIG. 7, which is a perspective view exemplary of a portion 70 of a power substrate 12 having metallic tracks 13 patterned thereon, one or more embodiments may comprise providing solder resist pads 72 onto the ceramic substrate 12 (in particular, onto the metallic layer 13) at the positions where the pin holders 16 are expected to be soldered.

The solder resist material dispensed onto the metallic layer 13 to create the solder resist pads 72 may have a thickness in the range of 10 μm to 50 μm (1 μm=$10^{-6}$ m), for instance equal to 20 μm or 25 μm.

The solder resist pads 72 have an outline or perimeter 74 of any size and shape (exemplified herein as a round or circular shape) which is adapted to accommodate the size and shape of, and thus enclose, the (cylindrical) base of the pin holders 16 plus a certain lateral margin. In general, such a margin between the perimeter of the base of a pin holder 16 and the perimeter 74 of the solder resist pad 72 (e.g., the minimum distance between the perimeter of the pad 72 and the perimeter of the base of the pin holder 16) may be in the range of 250 μm to 500 μm. For instance, r being the radius of the base of a pin holder 16, the solder resist pads 72 may have a round shape with a radius R in the range of (r+250 μm) to (r+500 μm). Purely by way of non-limiting example, the solder resist pads 72 may have a round shape with a radius R of 1.25 mm in case the base of the pin holders 16 has a radius r of 1 mm nominal.

Figure 8:
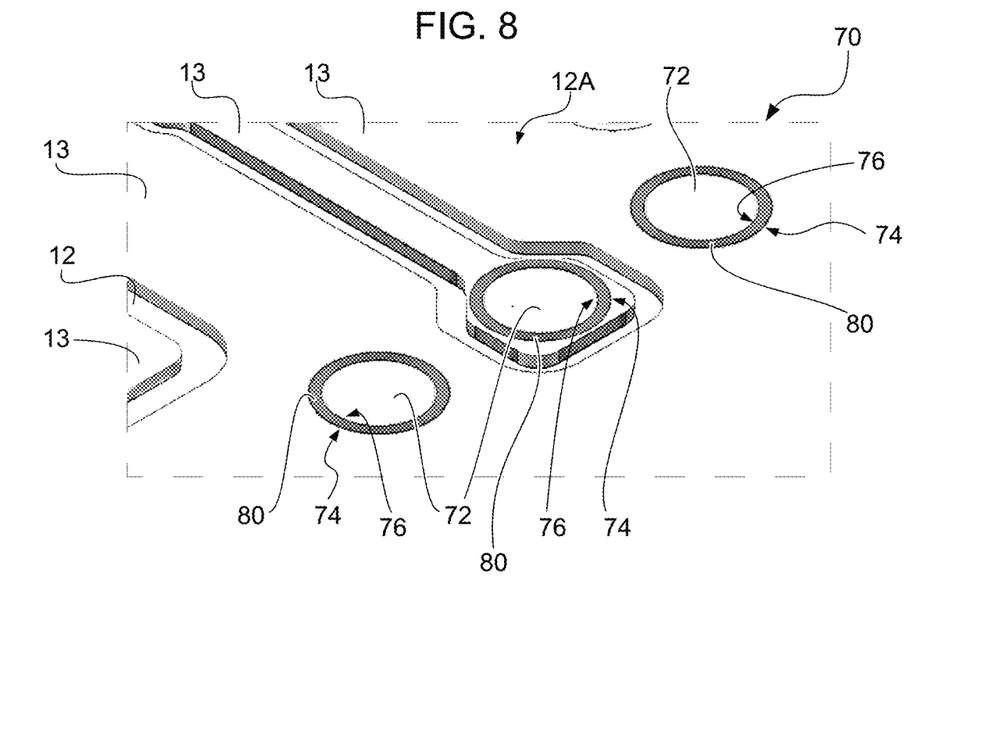
FIG. 8 is a perspective view exemplary of the power substrate of FIG. 7 in another step of a manufacturing method according to one or more embodiments of the present description.

As exemplified in FIG. 8, which is a perspective view exemplary of the portion 70 of the substrate 12 of FIG. 7 in a subsequent manufacturing step, a light beam (e.g., a laser beam from a laser source) may be directed onto the surface 12A of the substrate 12 to remove (e.g., to etch) an inner portion of the solder resist pads 72 where the base of the pin holders 16 is expected to be positioned. For instance, the light beam may be directed onto the surface 12A of the substrate 12 according to a determined CAD design, using certain reference signs (or alignment marks) provided on the surface of the base plate 18 to carry out a pattern recognition processing for alignment. The etching step performed on the solder resist pads 72 by means of a light beam may have a (lateral) accuracy of about 10 μm.

Therefore, in one or more embodiments, after such an etching step the solder resist pads 72 may annularly surround respective openings (e.g., circular openings) or cavities having a dimension approximately equal to the dimension of the base of the pin holders 16, or slightly bigger so as to facilitate accommodating the pin holders 16 therein. Each solder resist pad 72 may thus be delimited by an outer perimeter 74 and an inner perimeter 76, defining a perimeter (e.g., closed) wall of solder resist material which defines (or delimits) an inner region for attaching a pin holder 16 onto the metallic layer 13. For instance, r being the radius of the base of a pin holder 16, the inner perimeter 76 may have a radius R' in the range of r to (r+50 μm). Purely by way of non-limiting example, the inner perimeter 76 may have a radius R' of 1.05 mm in case the base of the pin holders 16 has a radius r of 1 mm nominal.

Therefore, the perimeter walls resulting from etching of the pads 72 may have a width (e.g., a distance between the inner perimeter 76 and the outer perimeter 74) in the range of 200 μm to 500 μm.

The solder resist pads 72 may be provided at selected positions of each substrate 12 before or after attaching the substrates 12 onto the base plate 18. However, the etching step exemplified in FIG. 8 may advantageously be carried out after attaching the substrates 12 onto the base plate 18 and using alignment marks provided on the base plate itself, so that the pin holders 16 may be accurately placed independently from the possible misalignments between the substrates 12.

Figure 9:
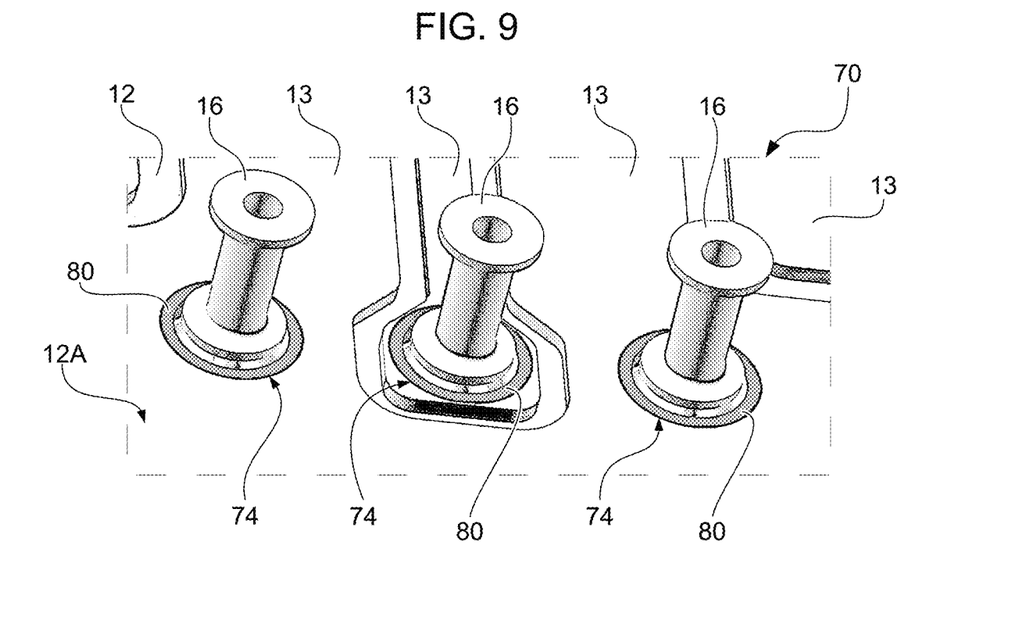
FIG. 9 is a perspective view exemplary of the power substrate of FIGS. 7 and 8 in another step of a manufacturing method according to one or more embodiments of the present description.

As exemplified in FIG. 9, which is a perspective view exemplary of the portion 70 of the substrate 12 of FIGS. 7 and 8 in a subsequent manufacturing step, the patterned (etched) solder resist pads 72 may be used as a sort of physical mask for the pin holder soldering and alignment step. Once the substrate(s) 12 have been mounted (e.g., attached via solder preforms 19) onto the base plate 18, a solder paste may be dispensed in the openings or cavities delimited by the solders resist walls 80. Therefore, a pin holder 16 may be attached with solder material and reflow within each solder resist opening. Advantageously, the pin holders 16 may self-align during the solder melting phase, insofar as each patterned solder resist pad 72 defines an opening or cavity designed to accommodate the base of a respective pin holder 16.

A manufacturing method as exemplified herein is particularly advantageous for the manufacture of electronic devices (e.g., power inverters) comprising a plurality of electronic circuits arranged on different power substrates 12, where the substrates are attached onto a common base plate 18, insofar as it improves the accuracy of the positioning of the electrically-conductive pins and compensates possible misalignments of one substrate with respect to the others. However, those of skill in the art will appreciate that a manufacturing method according to one or more embodiments may prove to be advantageous also for the manufacture of electronic devices comprising a single substrate, insofar as it improves the accuracy of the positioning of the electrically-conductive pins also within the same substrate by countering any shift of the pin holders 16 during the solder reflow step. In this latter case, etching of the solder resist pads 72 may rely on the use of reference signs (or alignment marks) provided on the surface 12A of the power substrate 12 to carry out a pattern recognition processing for alignment.

Therefore, one or more embodiments may render the positioning of the pin holder array virtually independent from the substrate location and positioning tolerance, insofar as the relative position between different substrates 12 and the absolute positioning with respect to the base plate 18 are "frozen" when the solder resist pads 72 are etched to provide the physical mask for the pin holder soldering and alignment step. One or more embodiments may therefore facilitate reducing the tolerances of the pin positions over the whole array of pins, thereby increasing the mechanical yield at the final assembly of the power module (e.g., when a PCB is mounted onto the power device).

Those of skill in the art will understand that various sections of the instant description refer to a power inverter device purely by way of example, and that one or more embodiments may be applied to any kind of power electronic device comprising interconnections implemented by means of electrically-conductive pins, e.g., press-fit pins.

Also, those of skill in the art will understand that various sections of the instant description refer to the provision of perimeter walls by means of etched solder resist pads purely by way of example, and that containment structures having similar shape and serving the same purpose may be provided according to alternative techniques and/or using different materials.

As exemplified herein, a method of manufacturing electronic devices may comprise:
 providing at least one substrate (e.g., 12) having electrically-conductive tracks (e.g., 13) patterned thereon;
 arranging on the at least one substrate at least one semiconductor chip, and electrically coupling the at least one semiconductor chip to selected ones of the electrically-conductive tracks;
 providing, at selected locations on the electrically-conductive tracks, containment structures (e.g., raised containment structures, 80) having respective perimeter walls (e.g., 74, 76) which define respective cavities configured to accommodate a base portion of respective pin holders (e.g., 16), each pin holder being for instance configured to hold an end portion of an electrically-conductive pin; and soldering the respective pin holders within the cavities defined by the containment structures on the electrically-conductive tracks.

As exemplified herein, soldering the pin holders within the cavities may comprise dispensing solder material into the cavities, arranging the pin holders into the cavities, and reflowing the solder material to settle the pin holders into the cavities.

As exemplified herein, a method according to one or more embodiments may further comprise:
attaching (e.g., via soldering and vacuum reflow) the at least one substrate onto a base plate (e.g., a common base plate such as a heat sink, 18);
inserting electrically-conductive pins (e.g., press-fit pins, 14) into the pin holders; and
fastening a cover plate (e.g., 20) to the base plate, the cover plate having a set of holes at positions corresponding to the selected locations on the electrically-conductive tracks where the containment structures are provided.

As exemplified herein, the base plate and the cover plate may provide a casing of a power electronic device containing the at least one substrate having the at least one semiconductor chip arranged thereon, and the electrically-conductive pins may protrude through the holes in the cover plate.

As exemplified herein, in one or more embodiments the step of attaching the at least one substrate onto a base plate may advantageously be performed before the step of providing the containment structures on the electrically conductive tracks.

As exemplified herein, providing the containment structures may comprise providing pads of resist material (e.g., solder resist material, 72) at the selected locations on the electrically-conductive tracks, and selectively removing respective inner portions of the pads of resist material to form the respective perimeter walls.

As exemplified herein, selectively removing the inner portions of the pads of resist material may comprise etching the inner portions of the pads of resist material.

As exemplified herein, etching the inner portions of the pads of resist material may comprise directing laser radiation onto the inner portions of the pads of resist material.

As exemplified herein, directing laser radiation onto the inner portions of the pads of resist material may comprise focusing a laser beam onto the at least one substrate, and a method according to one or more embodiments may comprise:
providing, on the base plate and/or on the at least one substrate, a set of alignment marks indicative of reference positions on the base plate and/or on the at least one substrate; and
scanning the laser beam onto the at least one substrate as a function of a pattern recognition processing of the alignment marks.

As exemplified herein, the perimeter walls may have a height in the range of 10 μm to 50 μm, optionally equal to 20 μm. For instance, the pads of resist material may be provided as a layer having a thickness of 10 μm to 50 μm, optionally equal to 20 μm.

As exemplified herein, the perimeter walls configured to accommodate a base portion of the respective pin holders may have a width (e.g., a distance between an inner perimeter 76 and an outer perimeter 74) in the range of 200 μm to 500 μm.

As exemplified herein, the perimeter walls configured to accommodate a base portion of the respective pin holders may have an inner radius in the range of r to r+50 r being a radius of the base portion of the respective pin holders.

As exemplified herein, the perimeter walls configured to accommodate a base portion of the respective pin holders may have an outer radius in the range of r+250 μm to r+500 μm, r being a radius of the base portion of the respective pin holders.

As exemplified herein, a method according to one or more embodiments may comprise providing a plurality of substrates and attaching the plurality of substrates onto a common base plate, and the step of providing the containment structures may be performed after the step of attaching the plurality of substrates onto the common base plate.

As exemplified herein, an electronic device (e.g., a power electronic device, 10) may comprise:
at least one substrate having electrically-conductive tracks patterned thereon;
at least one semiconductor chip arranged on the at least one substrate, the at least one semiconductor chip being electrically coupled to selected ones of the electrically-conductive tracks;
containment structures having respective perimeter walls which define respective cavities at selected locations on the electrically-conductive tracks, the cavities being configured to accommodate a base portion of respective pin holders; and
pin holders soldered within the cavities defined by the containment structures on the electrically-conductive tracks.

Without prejudice to the underlying principles, the details and embodiments may vary, even significantly, with respect to what has been described by way of example only, without departing from the extent of protection.

The claims are an integral part of the technical teaching provided herein in respect of the embodiments.

The extent of protection is determined by the annexed claims.

The invention claimed is:

1. A method, comprising:
providing a plurality of substrates having electrically-conductive tracks;
arranging a semiconductor chip on each substrate and electrically coupling the semiconductor chip to selected ones of said electrically-conductive tracks;
attaching said plurality of substrates onto a common base plate;
then providing containment structures at selected locations on said electrically-conductive tracks, wherein said containment structures have respective perimeter walls which define cavities having a size and shape configured to respectively accommodate a base portion of pin holders; and
soldering said pin holders within said cavities defined by said containment structures on said electrically-conductive tracks.

2. The method of claim 1, wherein said containment structures are made of a resist material and wherein soldering said pin holders within said cavities comprises:
dispensing solder material into said cavities;
arranging said pin holders in said cavities; and
reflowing said solder material to settle said pin holders in said cavities.

3. The method of claim 1, further comprising:
inserting electrically-conductive pins into said pin holders; and
fastening a cover plate to said common base plate, said cover plate having a set of holes at positions corresponding to said selected locations on said electrically-conductive tracks where the containment structures are provided;

whereby said common base plate and said cover plate provide a casing of a power electronic device containing the substrate having said semiconductor chip arranged thereon, and the electrically-conductive pins protrude through said holes in said cover plate.

4. The method of claim 1, wherein providing said containment structures comprises:

providing pads of resist material at said selected locations on said electrically-conductive tracks; and selectively removing resist material from respective inner portions of said pads to form said respective perimeter walls.

5. The method of claim 4, wherein selectively removing comprises etching said resist material from the inner portions of said pads.

6. The method of claim 4, wherein selectively removing comprises directing laser radiation at said pads to remove the resist material from said inner portions of said pads.

7. The method of claim 6, wherein directing laser radiation comprises focusing a laser beam onto said at least one substrate, and wherein the method further comprises:

providing a set of alignment marks on one or more of said common base plate and said plurality of substrates, wherein the set of alignment marks are indicative of reference positions; and scanning said laser beam onto plurality of substrates as a function of a pattern recognition processing of said set of alignment marks.

8. The method of claim 1, wherein a height of the containment structures is in the range of 10 µm to 50 µm.

9. The method of claim 1, wherein a width of the containment structures is in the range of 200 µm to 500 µm.

10. The method of claim 1, wherein each cavity defined by said perimeter wall has an inner radius in the range of r to r+50 µm, r being a radius of said base portion of said pin holders.

11. The method of claim 1, wherein said containment structures comprise a ring shape with an inner radius in the range of r to r+50 µm and an outer radius in a range of r+250 µm to r+500 µm, r being a radius of said base portion of said pin holders.

12. The method of claim 1, wherein providing containment structures further comprises providing each containment structure as a ring of resist material surrounding the cavity, the method further comprising placing solder material in cavity contained by the ring of resist material and placing the pin holder on the solder material in the cavity.

13. A method, comprising:

providing a substrate having electrically-conductive tracks;

arranging a semiconductor chip on the substrate and electrically coupling the semiconductor chip to selected ones of said electrically-conductive tracks;

attaching the substrate to a base plate;

providing a set of alignment marks on one or more of said base plate and said substrate, wherein the set of alignment marks are indicative of reference positions;

providing pads of resist material at selected locations on said electrically-conductive tracks;

based on said reference positions indicated by the set of alignment marks, selectively removing resist material from inner portions of said pads to respectively form perimeter walls of containment structures which define cavities; and soldering pin holders within said cavities defined by said containment structures on said electrically-conductive tracks;

wherein each cavity has a size and shape configured to accommodate a base portion of the pin holder.

14. The method of claim 13, further comprising:

inserting electrically-conductive pins into said pin holders; and fastening a cover plate to said base plate, said cover plate having a set of holes at positions corresponding to said selected locations on said electrically-conductive tracks where the containment structures are provided;

whereby said base plate and said cover plate provide an electronic device casing containing the substrate having said semiconductor chip arranged thereon, and the electrically-conductive pins protrude through said holes in said cover plate.

* * * * *